US007822396B2

(12) United States Patent
Mino

(10) Patent No.: US 7,822,396 B2
(45) Date of Patent: Oct. 26, 2010

(54) RADIO RECEIVER AND METHOD FOR DETECTING CARRIER WAVES

(75) Inventor: Osamu Mino, Kobe (JP)

(73) Assignee: Fujitsu Ten Limited, Kobe-shi (JP)

( * ) Notice: Subject to any disclaimer, the term of this patent is extended or adjusted under 35 U.S.C. 154(b) by 631 days.

(21) Appl. No.: 11/808,518

(22) Filed: Jun. 11, 2007

(65) Prior Publication Data

US 2007/0287398 A1 Dec. 13, 2007

(30) Foreign Application Priority Data

Jun. 13, 2006 (JP) ............................... 2006-163384

(51) Int. Cl.
*H04B 1/18* (2006.01)
(52) U.S. Cl. ................ 455/161.1; 455/164.1; 455/166.1
(58) Field of Classification Search .............. 455/161.1, 455/161.2, 164.1, 164.2, 183.1, 186.1, 192.1, 455/192.2
See application file for complete search history.

(56) References Cited

U.S. PATENT DOCUMENTS

| 5,487,186 | A | * | 1/1996 | Scarpa ..................... 455/192.2 |
| 5,574,995 | A | * | 11/1996 | Masaki ..................... 455/161.2 |
| 5,949,796 | A | * | 9/1999 | Kumar ....................... 370/529 |
| 6,067,332 | A | * | 5/2000 | Taura et al. ................. 375/344 |
| 6,088,569 | A | * | 7/2000 | Bach et al. .................. 725/149 |
| 6,898,249 | B2 | * | 5/2005 | Kroeger et al. .............. 375/259 |
| 6,970,685 | B2 | * | 11/2005 | Milbar et al. ............... 455/266 |
| 7,164,894 | B2 | * | 1/2007 | Nagahama et al. ........ 455/168.1 |
| 7,239,358 | B1 | * | 7/2007 | Mayer ......................... 348/731 |
| 7,564,503 | B2 | * | 7/2009 | Onomatsu .................... 348/732 |
| 2002/0008787 | A1 | * | 1/2002 | Kurihara ..................... 348/731 |
| 2004/0022229 | A1 | * | 2/2004 | Vanness ....................... 370/343 |
| 2004/0162048 | A1 | | 8/2004 | Milbar et al. |
| 2005/0101273 | A1 | | 5/2005 | Suto |
| 2005/0232431 | A1 | | 10/2005 | Kato |

FOREIGN PATENT DOCUMENTS

| JP | A-2000-004174 | 1/2000 |
| JP | A-2001-320290 | 11/2001 |
| JP | A-2004-349805 | 12/2004 |
| JP | A-2005-005484 | 1/2005 |
| JP | A-2005-005819 | 1/2005 |
| JP | A-2005-005848 | 1/2005 |
| JP | A-2005-117286 | 4/2005 |
| JP | A-2005-130058 | 5/2005 |
| JP | A-2005-191850 | 7/2005 |
| JP | A-2005-295449 | 10/2005 |
| JP | A-2006-033122 | 2/2006 |

* cited by examiner

*Primary Examiner*—Duc M Nguyen
(74) *Attorney, Agent, or Firm*—Oliff & Berridge, PLC

(57) ABSTRACT

An object of the present invention is to provide a radio receiver and a method for detecting carrier waves which make it possible to detect carrier waves for an IBOC type hybrid broadcast reliably. A radio receiver for receiving carrier waves for hybrid broadcasts which are arranged so as to be adjacent to and located on both sides of carrier waves for analog broadcasts in frequency bands includes a tuner for tuning to a broadcast frequency, and a controller for setting a center frequency of shift frequency in a range where carrier waves for an analog broadcast can be detected and allowing the tuner to tune to the set shift frequency.

10 Claims, 11 Drawing Sheets

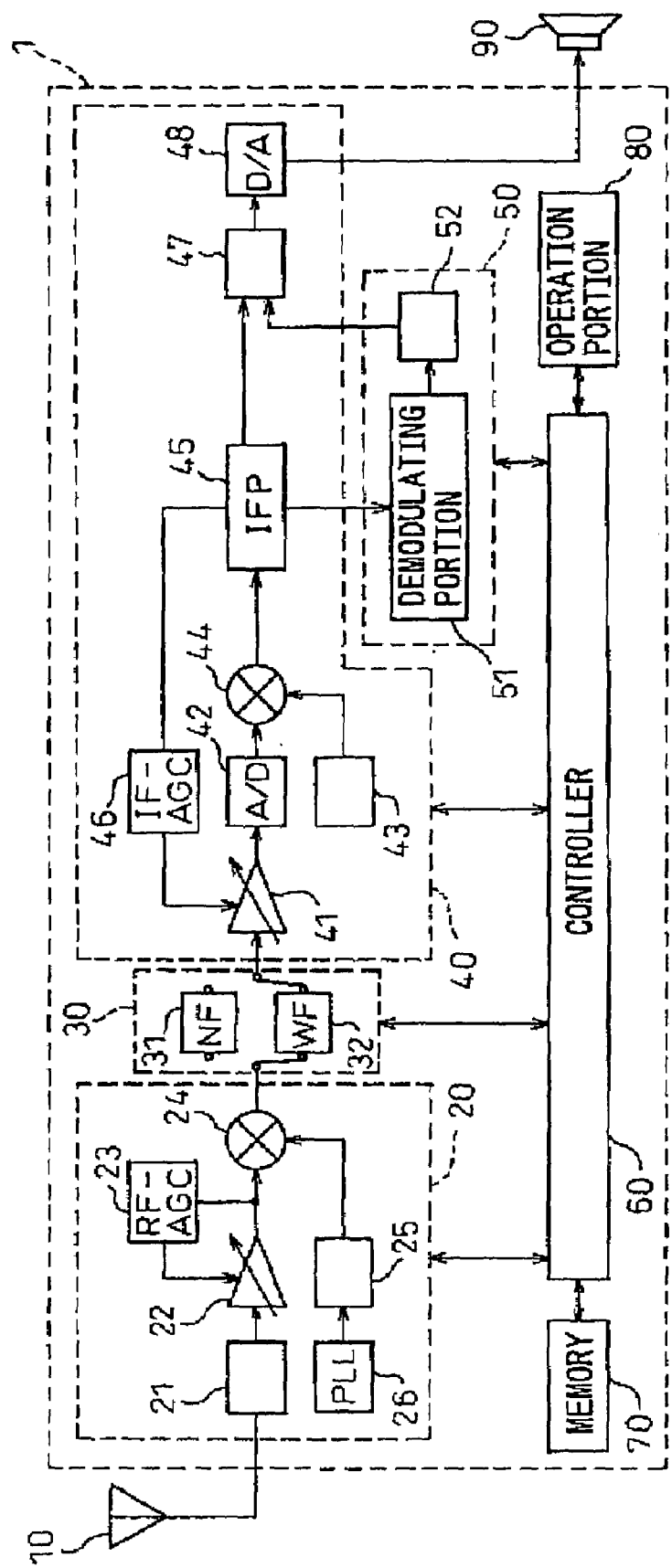

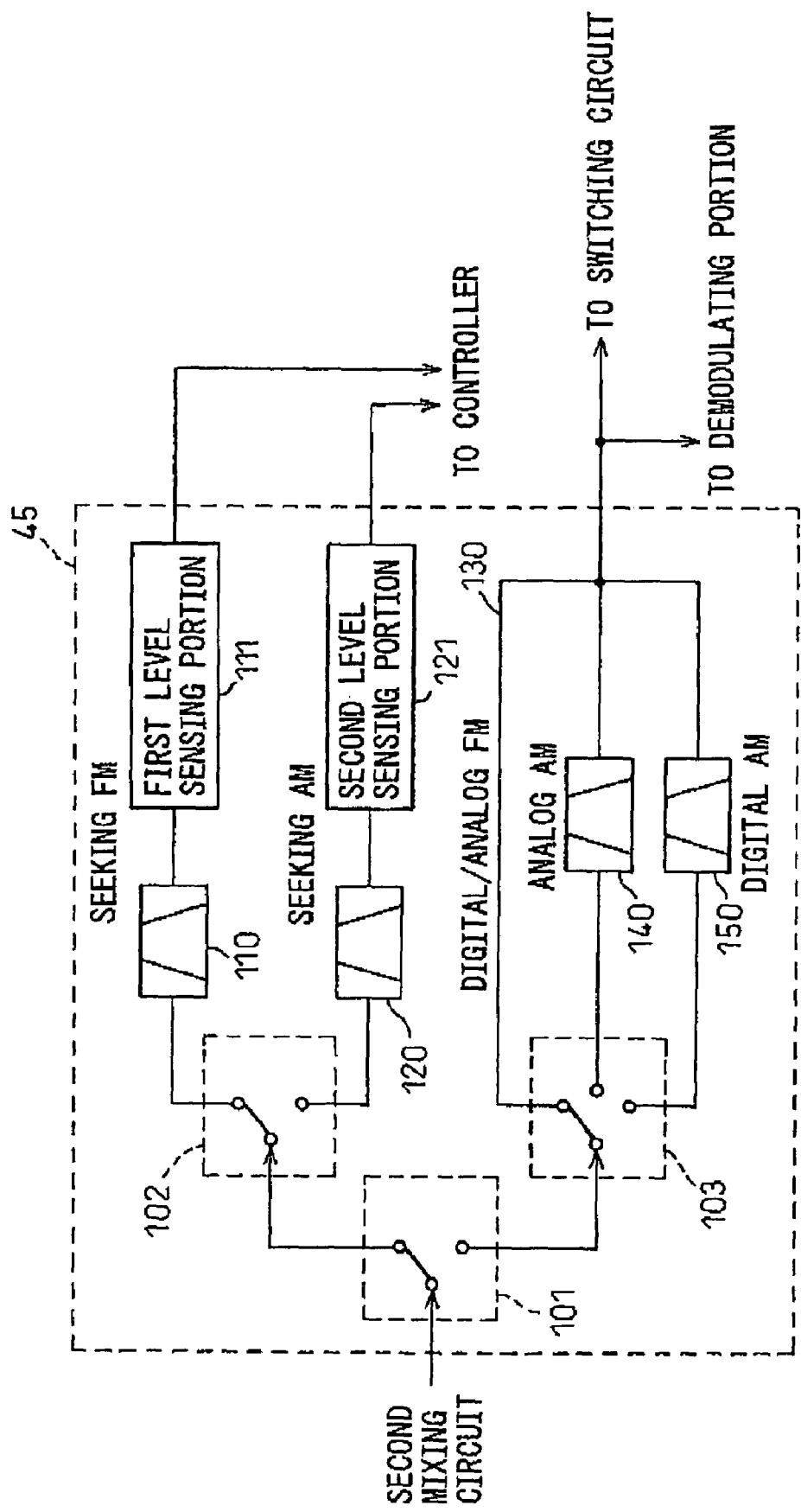

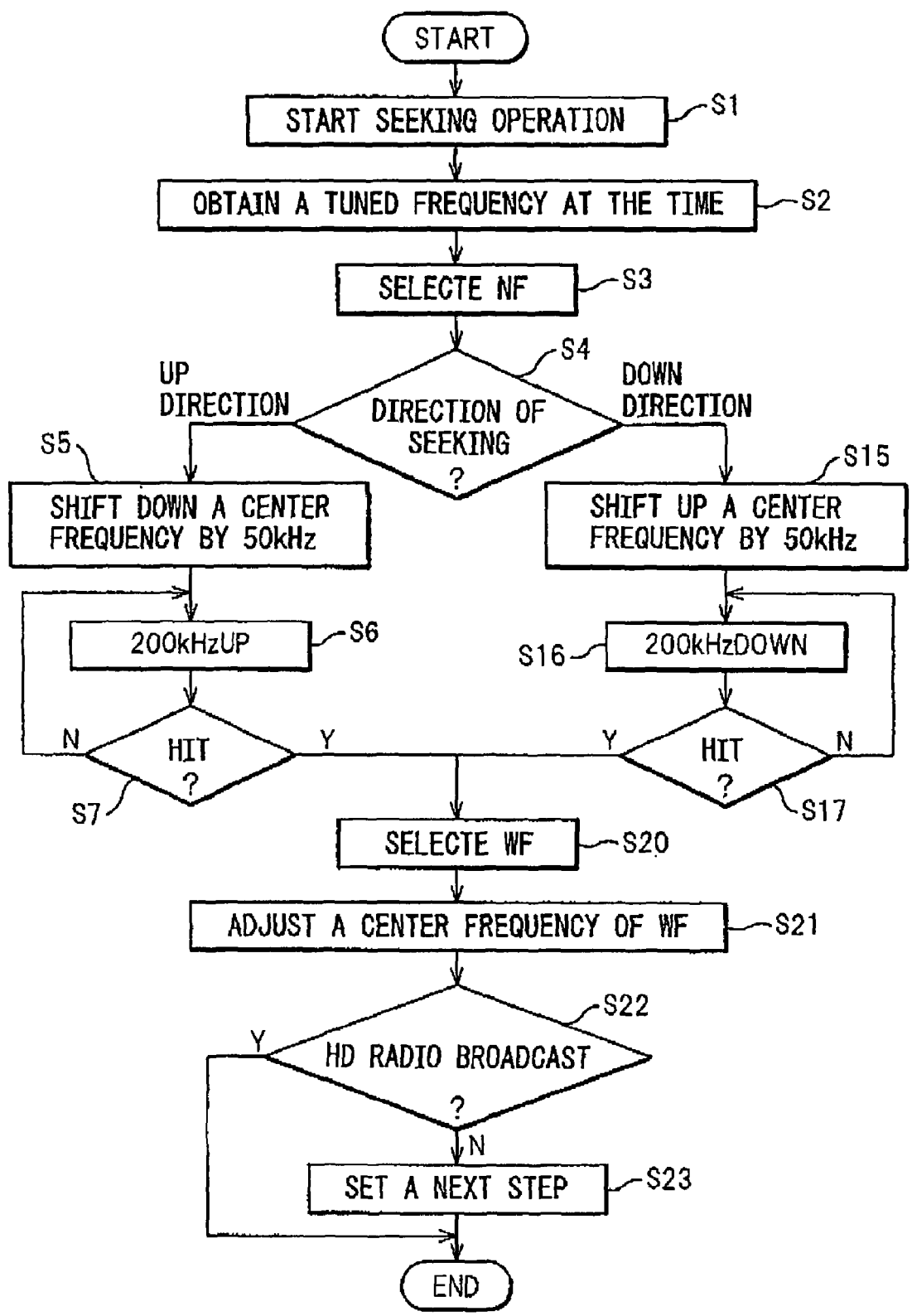

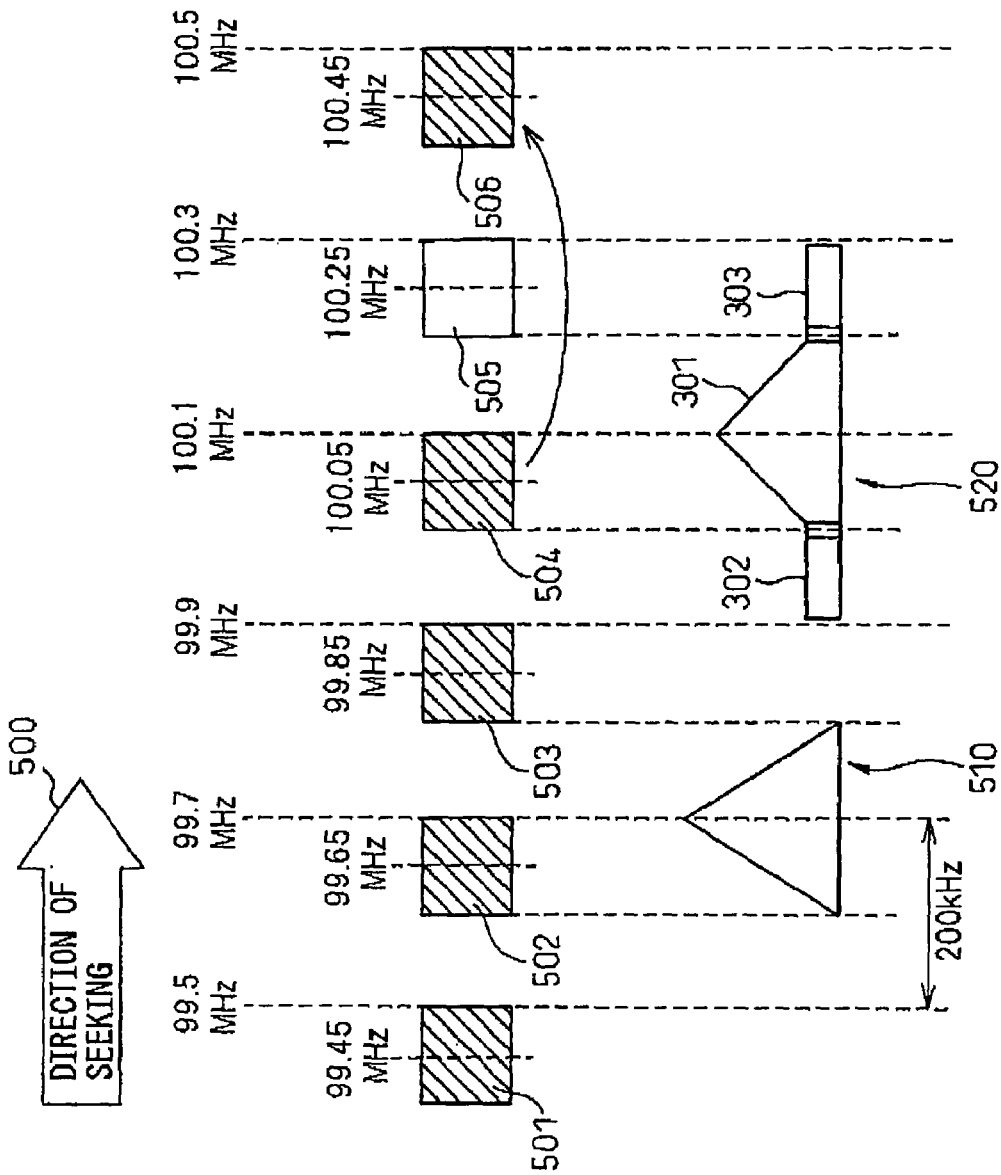

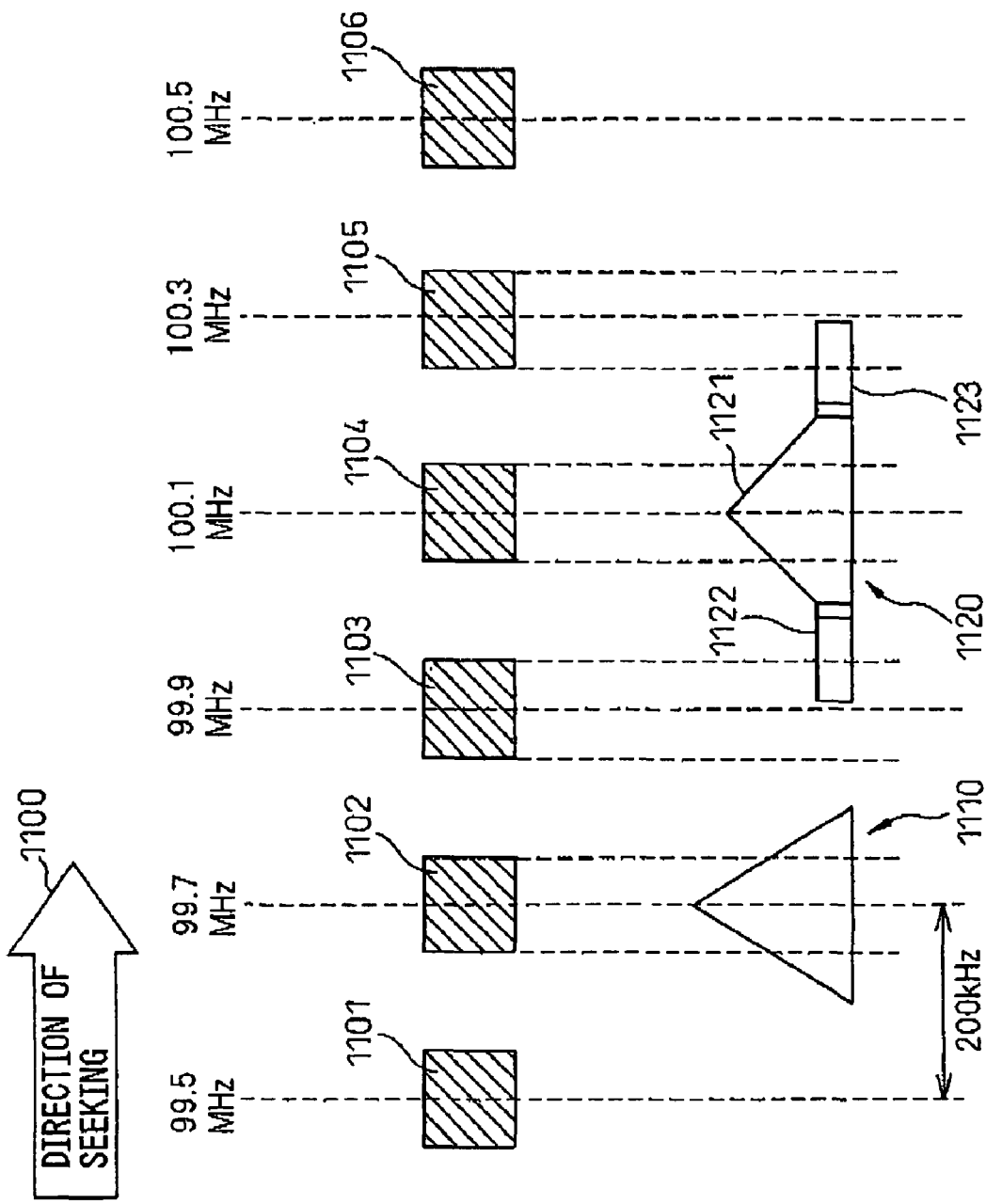

RADIO RECEIVER AND METHOD FOR DETECTING CARRIER WAVES

This application is a new U.S. patent application that claims benefit of Japanese Patent Application No. 2006-163,384, filed on Jun. 13, 2006, the entire content of the Japanese Patent Application No. 2006-163,384 is hereby incorporated by reference.

FIELD OF THE INVENTION

The present invention relates to a radio receiver and a method for detecting carrier waves in a radio receiver, and in particular, to a radio receiver for receiving carrier waves for hybrid type HD (High Definition) radio broadcasts, such as IBOC (In Band on Channel) type broadcasts, which are surface digital speech sound broadcasts in the United States, and a method for detecting such carrier waves.

BACKGROUND OF THE INVENTION

In the case where carrier waves for IBOC type HD radio broadcasts are used, carrier waves for digital broadcasts can be added to carrier waves for analog broadcasts. Accordingly, it is possible in an HD radio receiver to increase sound quality using carrier waves for digital broadcasts. Carrier waves for digital broadcasts and carrier waves for such IBOC type HD radio broadcasts are arranged so as to be located on both sides adjacent to carrier waves for analog broadcasts in the frequency band (see, for example, JP-A-2000-4174 (FIG. 6, page 3)). These broadcast waves are referred to as hybrid type waves.

However, all broadcasting stations do not necessarily simultaneously send carrier waves for IBOC type HD radio broadcasts. Accordingly, in a case where carrier waves for digital broadcasts are added to both sides of carrier waves for analog broadcasts and sent, and a case where only carrier waves for analog broadcasts are sent, are possible. In the case where an HD radio receiver carries out a seeking (searching) operation in this situation, two types of spectra are mixed, and a problem arises in that the seeking operation stops by mistake and/or waves are improperly received.

SUMMARY OF THE INVENTION

In the case where carrier waves for IBOC type HD radio broadcasts and carrier waves for analog broadcasts are mixed, the carrier waves for digital broadcasts on both sides of the carrier waves for analog broadcasts are first detected in the seeking operation for detecting the carrier waves for analog broadcasts, and in some cases, the seeking operation is temporarily stopped. However, there are no carrier waves for analog broadcasts in this portion, and therefore, noise is outputted from a speaker of a receiver. Here, in the case where the sensitivity for detection is low and no carrier waves for digital broadcasts are detected when the seeking operation is carried out, a converse problem arises in that the carrier waves for analog broadcasts for channels having a weak electrical field cannot be detected.

A problem described above in the seeking operation is described in reference to FIG. 11. As shown in the figure, an FM broadcasting station, for example, has a frequency band of which the center frequency is any of the frequencies set for every 200 kHz (hereinafter referred to as "allocated frequency"). In the figure, arrow 1100 indicates the direction of the upward seeking operation (direction in which the frequency is increased), and 1101 to 1106 indicate a frequency band (approximately 100 kHz) of a band filter having a center frequency which coincides with an allocated frequency. Carrier waves for broadcast 1110 are for an FM analog broadcast of which the center frequency is 99.7 MHz. Carrier waves for broadcast 1120 are for an IBOC type HD FM radio broadcast of which the center frequency is 100.1 MHz. Carrier waves for broadcast 1120 have carrier waves for analog broadcast 1121 and carrier waves for digital broadcasts 1122 and 1123, which are located on either side of the carrier waves for the analog broadcast.

When a user instructs the upward seeking operation, the receiver shifts up the center frequency of the band filter by 200 kHz, starting from 1101 to 1106. Furthermore, a tuning operation is carried out for each frequency and it is determined whether or not there are carrier waves for a broadcast in the frequency. In FIG. 11, in the case where the band filter is set to 1102 or 1104, it is possible to detect carrier waves for the broadcast, because there are carrier waves for an analog broadcast in this portion. However, in the case where the band filter is set to 1103 or 1105, carrier waves 1122 or 1123 for a digital broadcast in carrier waves 1120 for an IBOC type HD FM radio broadcast are detected, and a problem arises, such that the seeking operation is stopped. Furthermore, there are no carrier waves for an analog broadcast in this portion, and therefore, a problem arises, such that noise is outputted from a speaker of the receiver.

In addition, in the case where carrier waves for IBOC type HD radio broadcasts and carrier waves for analog broadcasts are mixed, it is necessary to determine whether carrier waves are for a digital broadcast or for an analog broadcast by carrying out a decoding process on each channel in the seeking operation, in which priority is placed on carrier waves for digital broadcasts. Accordingly, a problem arises in the seeking operation, such that processing takes time.

Therefore, an object of the present invention is to provide a radio receiver and a method for detecting carrier waves which make it possible to carry out a seeking operation in a short period of time without fail in the case where carrier waves for digital broadcasts, such as IBOC type broadcasts, and carrier waves for analog broadcasts are mixed.

Another object of the present invention is to provide a radio receiver and a method for detecting carrier waves which make it possible to carry out a reliable seeking operation without lowering the sensitivity for detection at the time of seeking in the case where carrier waves for digital broadcasts, such as IBOC type broadcasts, and carrier waves for analog broadcasts are mixed.

The radio receiver according to the present invention receives carrier waves for hybrid broadcasts which are arranged so as to be adjacent to and located on both sides of carrier waves for analog broadcasts in frequency bands, and includes a tuner for tuning to a broadcast frequency, and a controller for setting a center frequency of shift frequencies in a range where carrier waves for an analog broadcast can be detected and allowing the tuner to tune to the set shift frequency.

In addition, the radio receiver according to the present invention receives carrier waves for hybrid broadcasts, where carrier waves for first digital broadcasts are arranged so as to be adjacent to and located on both sides of carrier waves for analog broadcasts in frequency bands, and carrier waves for second digital broadcasts are arranged so as to be located between carrier waves for the above described first digital broadcasts and carrier waves for the above described analog broadcasts, and includes a tuner for tuning to a broadcast frequency, and a controller for setting a center frequency of shift frequencies in a range where carrier waves for a second digital broadcast can be detected and allowing the tuner to tune to the set shift frequency.

In accordance with the method for detecting carrier waves for hybrid broadcasts according to the present invention, in a radio receiver for receiving carrier waves for hybrid broadcasts which are arranged so as to be adjacent to and located on both sides of carrier waves for analog broadcasts in frequency bands, the method includes the steps of setting a center frequency of shift frequencies in a range where carrier waves for an analog broadcast can be detected, and tuning carrier waves for a broadcast in the set shift frequency.

In addition, in accordance with the method for detecting carrier waves fox hybrid broadcasts, in a radio receiver for receiving carrier waves for hybrid broadcasts, where carrier waves for first digital broadcasts are arranged so as to be adjacent to and located on both sides of carrier waves for analog broadcasts in frequency bands, and carrier waves for second digital broadcasts are arranged so as to be located between carrier waves for the above described first digital broadcasts and carrier waves for the above described analog broadcasts, the method includes the steps of setting a center frequency of shift frequencies in a range where carrier waves for a second digital broadcast can be detected, and tuning carrier waves for a broadcast in the set shift frequency.

The radio receiver according to the present invention includes a tuner for tuning to a broadcast frequency, a signal generator for generating a signal for detecting carrier waves for a broadcast in the frequency to which the tuner is tuned, and a controller for setting a shift frequency in accordance with the profile of carrier waves for hybrid broadcasts, allowing the tuner to tune to the set shift frequency so that a signal for detecting carrier waves for a broadcast is acquired from the signal generator and detecting carrier waves for a hybrid broadcast on the basis of the signal for detecting carrier waves for a broadcast.

In addition, the radio receiver according to the present invention includes a tuner for tuning to a broadcast frequency, a signal generator for generating a signal for detecting carrier waves for a broadcast in the frequency to which the tuner is tuned, and a controller for setting a shift frequency by shifting an allocated frequency by a predetermined frequency, allowing the tuner to tune to the set shift frequency so that a signal for detecting carrier waves for a broadcast is acquired from the signal generator, and detecting carrier waves for a hybrid broadcast on the basis of the signal for detecting carrier waves for a broadcast.

Furthermore, in the radio receiver according to the present invention, it is preferable for the controller to change the direction in which a shift frequency is shifted from an allocated frequency in accordance with the direction for tuning, and it is further preferable for the controller to change the direction in which a shift frequency is shifted from an allocated frequency in accordance with the direction for tuning and the modulation system of the frequencies for broadcasts. In the case of FM broadcasts, for example, a shift frequency is shifted down by 50 kHz at the time of an upward seeking operation, and a shift frequency is shifted up by 50 kHz at the time of a downward seeking operation in the configuration.

Furthermore, in the radio receiver according to the present invention, it is preferable for the controller to change the value of the frequency by which a shift frequency is shifted from an allocated frequency in accordance with the modulation system of frequencies for broadcasts. The predetermined value of the frequency by which a shift frequency is shifted from an allocated frequency is changed in accordance with, for example, FM broadcasts and AM broadcasts in the configuration.

Furthermore, in the radio receiver according to the present invention, it is preferable for the controller to change the step value for the next shift frequency in the case where carrier waves for a hybrid broadcast are detected. In the case where carrier waves for an analog broadcast are detected among carrier waves for hybrid broadcasts, the next shift frequency corresponds to a portion of carrier waves for a digital broadcast among the carrier waves for the same hybrid broadcasts, and therefore, the next shift frequency is once skipped, so that a portion of carrier waves for a digital broadcast among the carrier waves for the same hybrid broadcasts is not detected in the configuration.

Furthermore, in the radio receiver according to the present invention, it is preferable for the controller change the detection level on the basis of the signal for detecting carrier waves for the next broadcast in the case where carrier waves for hybrid broadcasts are detected. In the case where carrier waves for an analog broadcast are detected among carrier waves for hybrid broadcasts, the next shift frequency corresponds to the portion of carrier waves for a digital broadcast among the carrier waves for the same hybrid broadcasts, and therefore, the detection level is lowered, so that a portion of carrier waves for a digital broadcast among the carrier waves for the same HD radio broadcasts is not detected in the configuration.

The method for detecting carrier waves for a broadcast according to the present invention includes the steps of setting a shift frequency in accordance with the profile of carrier waves for hybrid broadcasts, making the tuner tune to the set shift frequency so that a signal for detecting carrier waves for a broadcast is acquired from the signal generator, and detecting carrier waves for a hybrid broadcast on the basis of the single for detecting carrier waves for a broadcast.

In addition, the method for detecting carrier waves for a broadcast according to the present invention includes the steps of setting a shift frequency by shifting an allocated frequency by a predetermined frequency, making the tuner tune to the set shift frequency so that a signal for detecting carrier waves for a broadcast is acquired from the signal generator, and detecting carrier waves for a hybrid broadcast on the basis of the single for detecting carrier waves for a broadcast.

In accordance with the radio receiver and the method for detecting carrier waves for broadcasts according to the present invention, the characteristic configuration of carrier waves for digital broadcasts in a broadcast system, for example an IBOC system, is perceivable, so that it can be detected, and therefore, it is possible to shorten the time for the seeking operation.

BRIEF DESCRIPTION OF THE DRAWINGS

These and other features and advantages of the present invention will be better understood by reading the following detailed description, taken together with the drawings wherein:

FIG. 1 is a block diagram schematically showing the configuration of a radio receiver according to the present invention;

FIG. 2 is a diagram schematically showing the configuration of an IF processor circuit;

FIG. 3 (b) is a diagram showing carrier waves for IBOC type HD (AM) radio broadcasts;

FIG. 4 is a flow chart showing a method for receiving FM according to the present invention;

FIG. 5 is a diagram (1) illustrating a seeking operation;

FIG. 11 is a diagram illustrating a problem with the seeking operation.

DESCRIPTION OF THE PREFERRED EMBODIMENT

Figure 3A:
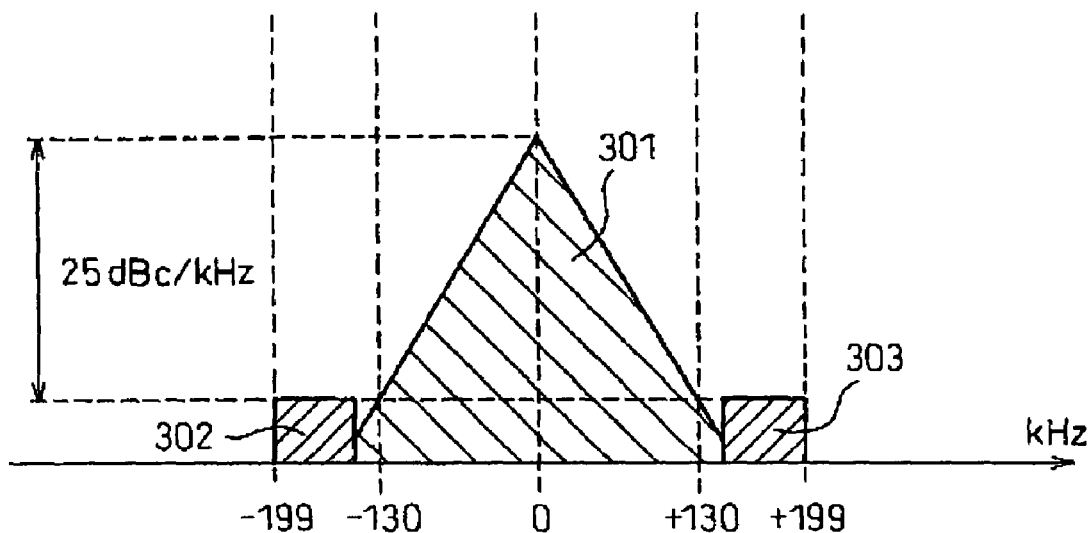
FIG. 3 (a) is a diagram showing carrier waves for IBOC type HD (FM) radio broadcasts.

In the following, a radio receiver and a method for detecting carrier waves according to the present invention are described with reference to the drawings. Here, it should be understood that the radio receiver and the method for detecting carrier waves according to the present invention are not limited to the following description, and various forms can be adopted, as long as they belong to the technological scope of the present invention.

In the following description, carrier waves for HD radio broadcasts, which are surface digital speech sound broadcasts in the United States, can be cited as representative examples of carrier waves for hybrid broadcasts. In addition, carrier waves for hybrid broadcasts refer to carrier waves for broadcasts where carrier waves for analog broadcasts and carrier waves for digital broadcasts are combined, such as carrier waves for HD radio broadcasts.

FIG. 1 is a diagram schematically showing an example of a radio receiver (for FM broadcasts) according to the present invention.

A radio receiver 1 is formed of a preprocessing portion 20, an IF (Intermediate Frequency) filter circuit 30, a digital signal processing portion 40, an IBOC processing portion 50, a controller 60 formed of a CPU and the like, a memory 70 formed of a variety of memories, including a RAM and a ROM, and an operation portion 80. In addition, the radio receiver 1 is connected to an antenna 10 and a speech sound outputting portion 90 formed of a speaker and the like.

The preprocessing portion 20 is formed of an electronic tuning type tuning circuit 21 for receiving a signal from the antenna 10, an RF (Radio Frequency) amplifying circuit 22, an RF-AGC (Auto Gain Control) circuit 23, a first mixing circuit 24, a first local oscillating circuit 25, a PLL tuning circuit 26 and the like. The preprocessing portion 20 is formed so as to be controllable by the controller 60. The RF amplifying circuit 22 is formed in such a manner that the gain can be adjusted by the RF-AGC circuit 23. The S1 level signal (signal showing the state of an electrical field) from the RF-AGC circuit 23 is used to detect carrier waves for the below described IBOC type digital broadcasts. The first local oscillating circuit 25 generates a first local oscillating signal in a predetermined frequency step following the PLL controlling signal supplied from the PLL tuning circuit 26 in accordance with the control signal from the controller 60 in a PLL synthesizer system. The received signal of a high frequency that has been amplified in RF amplifying circuit 22 is mixed with the first local oscillating signal in the first mixing circuit 24 so as to be converted to an intermediate frequency signal, and inputted into the IF filter circuit 30.

The IF filter circuit 30 includes an NF 31, which is a BPF (band Pass Filter) having a band width of approximately 200 KHz, and a WF 32, which is a BPF having a band width of approximately 400 KHz and is switch controlled by the control signal from the controller 60. The NF 31 and the WF 32 are analog filters for sampling components included in a predetermined band in response to the center frequency of the inputted intermediate frequency signal.

The digital signal processing portion 40 is formed of an IF amplifying circuit 41, an A/D converting circuit 42, a second local oscillating circuit 43, a second mixing circuit 44, an IF processor circuit 45, an IF-AGC circuit 46, a switching circuit 47, a D/A converting circuit 48 and the like. The digital signal processing portion 40 is formed so as to be controllable by the controlling portion 60. The IF amplifying circuit 41 is formed so that the gain can be adjusted by the IF-AGC circuit 46.

IF frequency signals that pass through the IF filter circuit 30 are amplified in the IF amplifying circuit 41 and converted to a digital signal in the A/D converting circuit 42. Furthermore, the digital signal outputted from the A/D converting circuit 42 is mixed with the second local oscillating signal outputted from the second local oscillating circuit 43 in the second mixing circuit 44 and inputted into the IF processor circuit 45. The IF processor circuit 45 outputs a speech sound signal of carrier waves for an analog broadcast to the switching circuit 47 and outputs a signal of carrier waves for a digital broadcast to the IBOC processing portion 50. The IF processor circuit 45 is described in the following.

The IBOC processing portion 50 is formed of a demodulating portion 51, a channel decoder 52 and the like. The IBOC processing portion 50 is formed so as to be controlled by the controller 60. The demodulating portion 51 has a function of demodulating OFDM (orthogonal frequency division multiplexing) sub carrier waves included in carrier waves for digital broadcasts. In the case where the demodulated signal is a speech sound signal, a speech sound signal is generated by the channel decoder 52 and outputted to the switching circuit 47. In addition, in the case where text data or image data is included in the demodulated signal, text data and image data is generated by a dedicated decoder, not shown, and stored in the memory 70. Stored text data and image data is displayed on a displaying portion (not shown) with predetermined timing. Here, in the case where text data or image data is generated, it can be determined that carrier waves for the broadcast that is being demodulated at the time are carrier waves for a digital broadcast.

The controller 60 controls the switching circuit 47 so that either a speech sound signal of carrier waves for an analog broadcast or a speech sound signal decoded from carrier waves for a digital broadcast is selected. The speech sound signal selected by the switching circuit 47 is converted to an analog signal by the D/A converting circuit 48 and outputted to the outputting means 90, for example a speaker mounted in a car.

The operation portion 80 includes various buttons and knobs for tuning, setting the volume and the like. In addition, the operation portion 80 includes at least a button for upward seeking (in the direction in which the frequency is increased) and a button for downward seeking (in the direction in which the frequency is decreased).

FIG. 2 is a diagram schematically showing the configuration for filter switching of the IF processor circuit 45.

As shown in FIG. 2, the IF processor circuit 45 is formed of a first switch 101, a second switch 102, a third switch 103, a BPF for seeking FM 110, a first level sensing portion 111, a BPF for seeking AM 120, a second level sensing portion 121, a signal path for carrier waves for FM broadcasts 130, a BPF for analog AM 140, a BPF for digital AM 150 and the like.

The first to third switches 101 to 103 are switched by the controller 60. The BPF for seeking FM 110 is a digital filter for a bandwidth of approximately 100 kHz and used at the time of the below described seeking operation for FM broadcasts. In addition, the BPF for seeking AM 120 is a digital filter for a bandwidth of approximately 4 kHz and used at the time of the below described seeking operation for AM broadcasts. A first sensing signal from the first level sensing portion 111 and a second sensing signal from the second level sensing portion 121 are transmitted to the controller 60 in the configuration.

The signal path for carrier waves for FM broadcasts 130 is used as a path for signals of carrier waves for an FM broadcast when FM digital broadcasts and FM analog broadcasts are received. In addition, the BPF for analog AM 140 is a digital filter for a bandwidth of approximately 9 kHz, which includes carrier waves for AM analog broadcasts, and used when AM analog broadcasts are received, as described below. Furthermore, the BPF for digital AM 150 is a digital filter for a bandwidth of approximately 35 kHz, which includes carrier waves for AM digital broadcasts, and used when AM digital broadcasts are received, as described below.

Figure 3B:
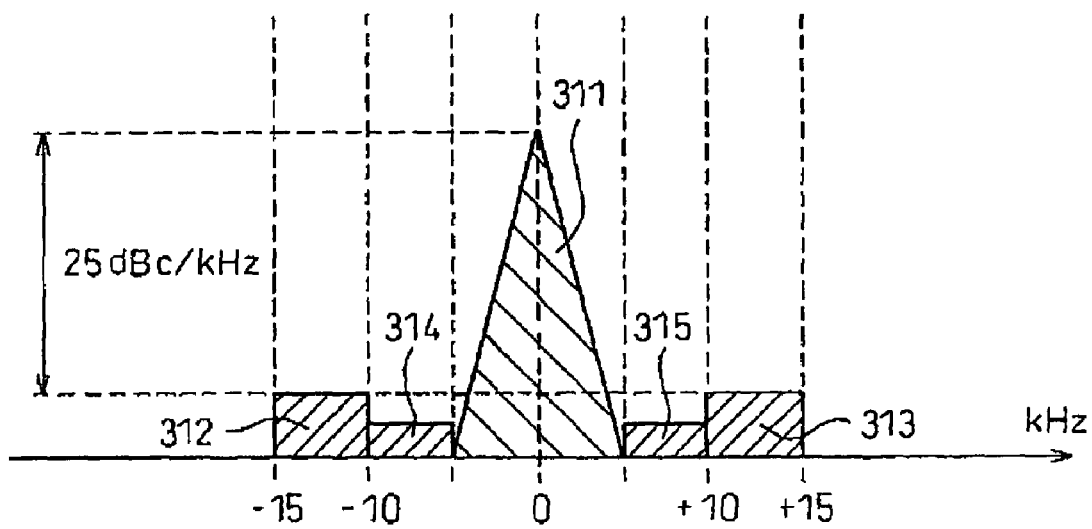

FIG. 3 is diagram showing the profile of carrier waves for IBOC type HD radio broadcasts. FIG. 3 (*a*) shows an example of FM waves and FIG. 3 (*b*) shows an example of AM waves.

As shown in FIG. 3 (*a*), carrier waves for digital broadcasts 302 and 303 are arranged so as to be adjacent to the band on the upper side and the band on the lower side of the frequency band of carrier waves for an analog broadcast (FM analog signal) 301, respectively. The carrier waves for digital broadcasts 302 and 303 are formed of a number of sub carrier waves that have been OFDM modulated, and as shown in the figure, occupy the spectra off from the center frequency of the FM analog signal by 130 kHz to 199 kHz and −130 kHz to −199 kHz. Furthermore, the peak value of the carrier waves for digital broadcasts 302 and 303 is set −25 dB/kHz below the peak value of the FM analog signal.

As shown in FIG. 3 (*b*), carrier waves for first digital broadcasts 312 and 313 are arranged so as to be adjacent to the band on the upper side and the band on the lower side of the frequency band of carrier waves for an analog broadcast (AM analog signal) 311, respectively. The carrier waves for digital broadcasts 312 and 313 are formed of a number of sub carrier waves that have been OFDM modulated, and as shown in the figure, occupy the spectra off from the center frequency of the AM analog signal by 5 kHz to 15 kHz and −15 kHz to −15 kHz. Furthermore, the peak value of the carrier waves for IBOC digital broadcasts 312 and 313 is set −25 dB/kHz below the peak value of the AM analog signal. Furthermore, carrier waves for second digital broadcasts 314 and 315 are arranged between the carrier waves for an analog broadcast 311 and the carrier waves for digital broadcasts 312 and 213, respectively.

FIG. 4 is a flow chart showing an example of a receiving method (for FM broadcasts) according to the present invention.

The receiving flow is carried out mainly by the controller 60, which works together with the respective components following a program that has been stored in advance in the controller 60 or the like in the radio receiver 1 shown in FIG. 1. At the point in time when the flow in FIG. 4 is carried out, the power of the radio receiver 1 is turned ON, so that the respective components are maintained in an operable state.

This process is started when the user operates a predetermined button (button for seeking upward or button for seeking downward) in the operation portion 80 (S1).

The controller 60 acquires information on the frequency tuned at the time when receiving instruction to start the seeking operation (S2). The controller 60 controls the IF filter circuit 30 and carries out switching, so that the NF 31 for a bandwidth of approximately 200 kHz can be used (S3). The controller 60 switches between the first and second switches 101 and 102 in the IF processor circuit 45 and controls the BPF for seeking FM 110 so that it can be used, and thus, receives a first sensing signal from the first level sensing portion 111.

In the case where the button operated by the user is a button for upward seeking, the controller 60 controls the preprocessing portion 20 so as to shift down the shift frequency for seeking from an allocated frequency by 50 kHz (S4 and S5). In addition, the controller 60 shifts up the tuned frequency by one frequency step (200 KHz) of the allocated frequency (S6). That is to say, the controller 60 controls the PLL tuning circuit 26 so that the tuning circuit 21 is tuned to the shift frequency, and thus, carries out control so that the center frequency of the BPF for seeking FM 110 coincides with the shift frequency.

Next, the controller 60 acquires a first sensing signal from the first level sensing portion 111 and determines whether or not carrier waves for a broadcast exist within the bandwidth of the BPF for seeking FM 110 (S7). Whether or not carrier waves for a broadcast exist is determined on the basis of the signal level and the like of the first sensing signal. In the case where it is determined that no carrier waves for a broadcast exist (no hit), the procedure returns to S6, and the tuned frequency is shifted up by one frequency step (200 KHz) of the allocated frequency, and thus, the subsequent operation is repeated.

In the case where the button operated by the user is a button for downward seeking, the controller 60 controls the preprocessing portion 20 and shifts the shift frequency for upward seeking from the allocated frequency by 50 kHz (S4 and S15). The controller 60 shifts down the tuned frequency by one frequency step (200 KHz) of the allocated frequency (S16). That is to say, the controller 60 controls the PLL tuning circuit 26 so that the tuning circuit 21 is tuned to the shift frequency, and carries out control so that the center frequency of the BPF for seeking FM 110 coincides with the shift frequency.

Next, the controller 60 acquires a first sensing signal from the first level sensing portion 111 and determines whether or not carrier waves for a broadcast exist within the bandwidth of the BPF for seeking FM 110 (S17). Whether or not carrier waves for a broadcast exist is determined on the basis of the signal level and the like of the first sensing signal. In the case where it is determined that no carrier waves for a broadcast exist (no hit), the procedure returns to S16, and the tuned frequency is shifted down by one frequency step (200 KHz) of the allocated frequency, and thus, the subsequent operation is repeated.

Next, in the case where it is determined in S7 or S17 that carrier waves for a broadcast exist (hit), the controller 60 controls the IF filter circuit 30 and carries out switching so that the WF 32 can be used (S20).

The controller 60 adjusts the WF 32 so that the frequency gained by correcting the frequency selected in S6 or S16 by the amount shifted in S5 or S15 becomes the center frequency (S21). Next, on the basis of the output which is outputted from the IBOC processing portion 50 in response to the entirety of the carrier waves for broadcasts within the bandwidth (approximately 400 kHz) in the WF 32, the controller 60 determines whether the tuned carrier waves for a broadcast are carrier waves for an HD FM radio broadcast or carrier waves for a simple FM analog broadcast (S22).

The determination in S22 can be carried out depending on, for example, whether or not carrier waves for a digital broadcast are detected. In this case, the controller 60 switches the first and third switches 101 and 103 in the IF processor circuit 45, so that the path for carrier waves for FM broadcasts 130 can be used, and carries out control so that the signal of carrier waves for an FM broadcast that passes through the WF 32 is inputted into the IBOC processing portion 50 without change. Furthermore, the controller 60 can determine on the basis of the detection signal from the IBOC processing portion 50 whether the carrier waves are for an HD FM radio broadcast or a simple FM analog broadcast.

As a result of the determination in S22, in the case where the carrier waves are determined to be for an HD FM radio broadcast, a step for the next seeking operation is set (S23), and the sequence of the seeking operation is completed. Setting of a step for the next seeking operation means setting where the shift frequency of the NF 31 which is shifted at the time of the next seeking operation is temporarily changed, and the details of this are described below.

FIG. 5 is a diagram for illustrating the upward seeking operation in the case of FM broadcasts.

In FIG. 5, arrow 500 indicates the direction of the upward seeking operation (direction in which the frequency is increased) and 501 to 506 indicate bandwidths (approximately 100 kHz) of the BPF for seeking FM 110 having the center frequency shifted down by 50 kHz (see S5 in FIG. 4).

FM broadcasting stations have a frequency band of which the center frequency is one of the allocated frequencies arranged for every 200 kHz. In the case of FIG. 5, carrier waves for an FM analog broadcast 510 having a center frequency of 99.7 MHz and carrier waves for an IBOC type HD FM radio broadcast 520 having a center frequency of 100.1 MHz (see FIG. 3 (*a*)) are in a range from 99.5 MHz to 100.5 MHz.

A tuned frequency is acquired, for example, at a certain point in time (see S2 in FIG. 4), the center frequency of the BPF for seeking FM 110 is adjusted so as to be shifted down from the acquired frequency by 50 kHz (see S5 in FIG. 4), the center frequency of the BPF for seeking FM 110 is shifted up by 200 kHz each time (see S6 in FIG. 4), and whether or not carrier waves for a broadcast exist in the bandwidth of the BPF for seeking FM 110 is determined.

In the case of FIG. 5, carrier waves for an analog broadcast 510 are detected at the point in time when the bandwidth of the BPF for seeking FM 110 is shifted up to 502, and the seeking operation is temporarily stopped. After that, in the case where the upward seeking operation is started again, the portion of the carrier waves for an analog broadcast in carrier waves for an HD radio broadcast 520 is detected at the point in time when the bandwidth of the BPF for seeking FM 110 is shifted up to 504, and the seeking operation is temporarily stopped. At the point in time when the portion of carrier waves for an analog broadcast in the carrier waves for an HD radio broadcast 520 is detected, it is determined in the controller 60 that the carrier waves for a broadcast 520 are carrier waves for an HD radio broadcast through the IBOC processing portion 50. In the case where the detected carrier waves for a broadcast are carrier waves for an HD radio broadcast, the next setting for a step is set so as to skip one step (see S24 in FIG. 4). Accordingly, in the case where the upward seeking operation is started again after this, the bandwidth of the BPF for seeking FM 110 is not shifted up to 505 but to 506 by skipping one step.

In this manner, in the case of an upward seeking operation, the shift frequency (center frequency of the BPF for seeking FM 110) is set 50 kHz below the allocated frequency, and thus, the portion of the carrier waves for the digital broadcast on the lower side of the carrier waves for an IBOC type HD FM radio broadcast is not detected (see 302 in FIG. 3 (*a*)). That is to say, carrier waves for the digital broadcast on the lower side (low frequency side) of carrier waves for an IBOC type HD FM radio broadcast are not detected, and thus, the seeking operation is not unnecessarily temporarily stopped, and no noise is outputted.

Furthermore, in the case where carrier waves for an IBOC type HD FM radio broadcast are detected once, the next step is set as an increase of 400 kHz by skipping one step (skipping the setting to 505), instead of an increase of 200 kHz, and thus, the portion of carrier waves for the digital broadcast on the upper side of an IBOC type HD FM radio broadcast (see 303 in FIG. 3 (*a*)) is not detected. That is to say, carrier waves for the digital broadcast on the upper side (high frequency side) of carrier waves for an IBOC type HD FM radio broadcast are not detected, and thus, the seeking operation is not temporarily stopped, and no noise is produced.

Figure 6:
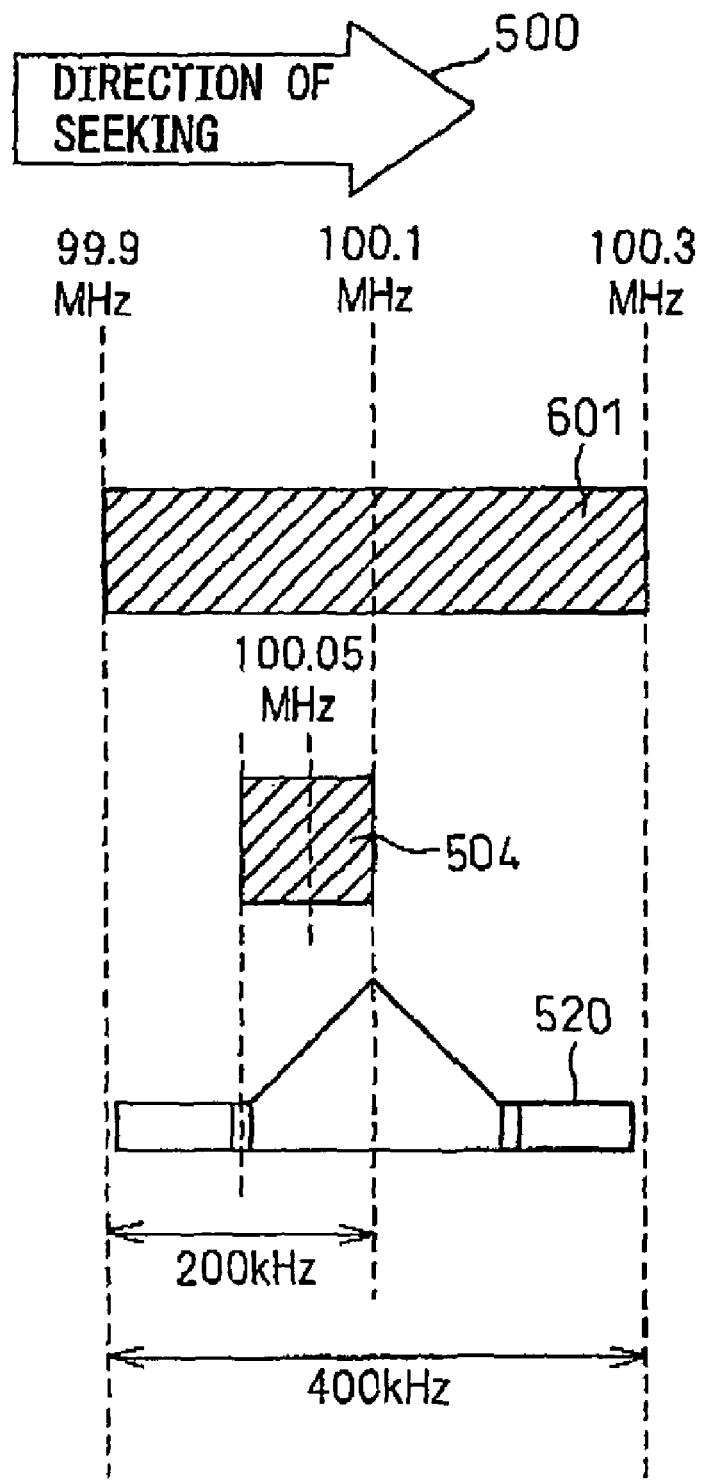
FIG. 6 is a diagram for illustrating a switching operation of a filter.

FIG. 6 is a diagram illustrating the switching operation of a filter in the case of FM broadcasts.

In FIG. 6, arrow 500 indicates the direction of the upward seeking operation (direction in which the frequency is increased), 504 indicates the bandwidth (approximately 100 kHz) of the BPF for seeking FM 110 having a center frequency that has been shifted down by 50 kHz (see S5 in FIG. 4), and 601 indicates the bandwidth (approximately 400 kHz) of the WF 32 after the center frequency has been adjusted (see S21 in FIG. 4).

In the case where the existence of carrier waves for a broadcast 520 is confirmed in 504 of FIG. 5 (see S7 in FIG. 4), the filter is switched from the NF 31 to the WF 32 (see S20 in FIG. 4). The WF 32 covers all of the carrier waves for an IBOC type HD FM radio broadcast 520, and thus, it becomes possible to determine that carrier waves for a broadcast 520 of which the existence has been confirmed are carrier waves for an IBOC type HD FM radio broadcast.

Figure 7:
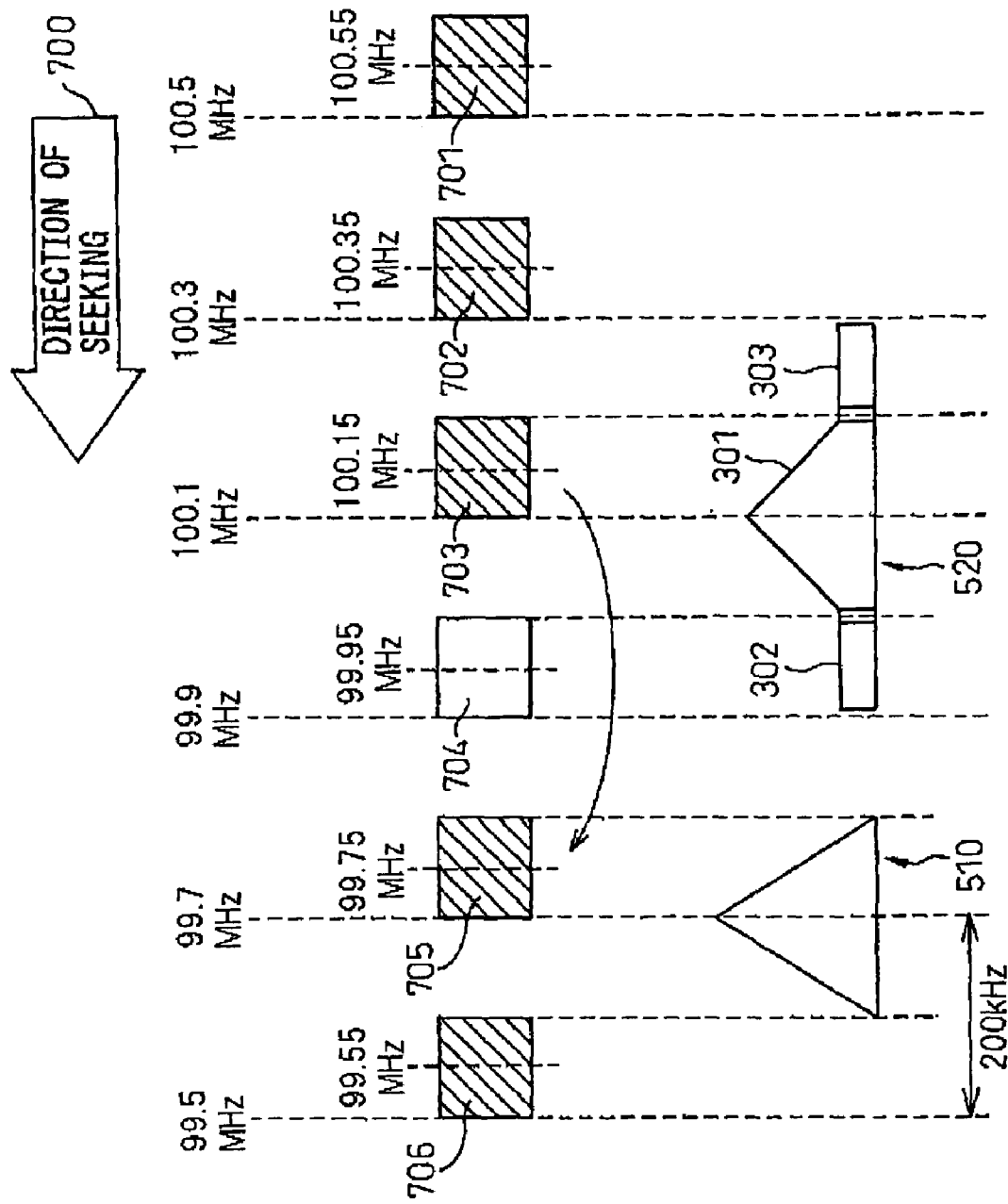
FIG. 7 is a diagram (2) illustrating a seeking operation.

FIG. 7 is a diagram illustrating the downward seeking operation in the case of FM broadcasts.

In FIG. 7, arrow 700 indicates the direction of the downward seeking operation (direction in which the frequency is lowered) and 701 to 706 indicate the bandwidths (approximately 100 kHz) of the BPF for seeking FM 110 having a center frequency that has shifted up by 50 kHz (see S15 in FIG. 4).

In the same manner as in the case of FIG. 5, in FIG. 7, carrier waves for an FM analog broadcast 510 having a center frequency of 99.7 MHz and carrier waves for an IBOC type HD FM radio broadcast 520 having a center frequency of 100.1 MHz (see FIG. 3 (*a*)) are in a range from 99.5 MHz to 100.5 MHz.

A tuned frequency is acquired (see S2 in FIG. 4), for example, at a certain point in time, the center frequency of the BPF for seeking FM 110 is adjusted so as to be shifted up by 50 kHz from the acquired frequency (see S15 in FIG. 4), the center frequency of the BPF for seeking FM 110 is shifted down by 200 kHz for each time (see S16 in FIG. 4), and whether or not carrier waves for a broadcast exist in the bandwidth of the BPF for seeking FM 110 exist is determined.

In the case of FIG. 7, carrier waves for an IBOC type HD FM radio broadcast 520 are detected at the point in time when the bandwidth of the BPF for seeking FM 110 is shifted down to 703, and the seeking operation is temporarily stopped. It is determined in the controller 60 that the carrier waves for a broadcast 520 are carrier waves for an HD FM radio broadcast through the IBOC processing portion 50 at the point in time when the portion of carrier waves for an analog broadcast in the carrier waves for a broadcast 520 is detected. In the case where the detected carrier waves for a broadcast are carrier waves for an HD FM radio broadcast, the next setting for a step is set so as to skip one step (see S24 in FIG. 4). Accordingly, in the case where the downward seeking operation is started again after this, the bandwidth of the BPF for seeking FM 110 is shifted down to 705 so as to skip one step instead of being shifted down to 704.

In this manner, in the case of the downward seeking operation, the shift frequency (center frequency of the BPF for seeking FM 110) is set 50 kHz above the allocated frequency, and thus, a portion of carrier waves for a digital broadcast on the upper side of carrier waves for an IBOC type HD FM radio broadcast (see 303 in FIG. 3 (*a*)) is not detected. That is to say, carrier waves for a digital broadcast on the upper side (high frequency side) of carrier waves for an IBOC type HD FM radio broadcast are not detected, and thus, the seeking operation is not unnecessarily temporarily stopped and no noise is outputted.

Furthermore, in the case where carrier waves for an IBOC type HD FM radio broadcast are once detected, the next step to shift down to 400 kHz by skipping one step instead of shifting down to 200 kHz (setting to 704 is skipped), and thus, the portion of carrier waves for a digital broadcast on the lower side of carrier waves for an IBOC type HD FM radio broadcast (see 302 in FIG. 3 (*a*)) is not detected. That is to say, carrier waves for a digital broadcast on the lower side (low frequency side) of carrier waves for an IBOC type HD FM radio broadcast are not detected, and thus, the seeking operation is not unnecessarily temporarily stopped and no noise is outputted.

Here, the amount of shift (50 kHz) of the center frequency of the BPF for seeking FM 110 and the bandwidth of the BPF for seeking FM 110 in the above described example of a method for receiving FM are examples, and it is possible to select other appropriate values on the basis of the profile of carrier waves for HD FM radio broadcasts. The amount of shift of the center frequency and the bandwidth of the BPF for seeking FM 110 may be set so as to avoid carrier waves for a digital broadcast in carrier waves for HD FM radio broadcasts which exist on the front side when facing the seeking direction, for example.

Figure 8:
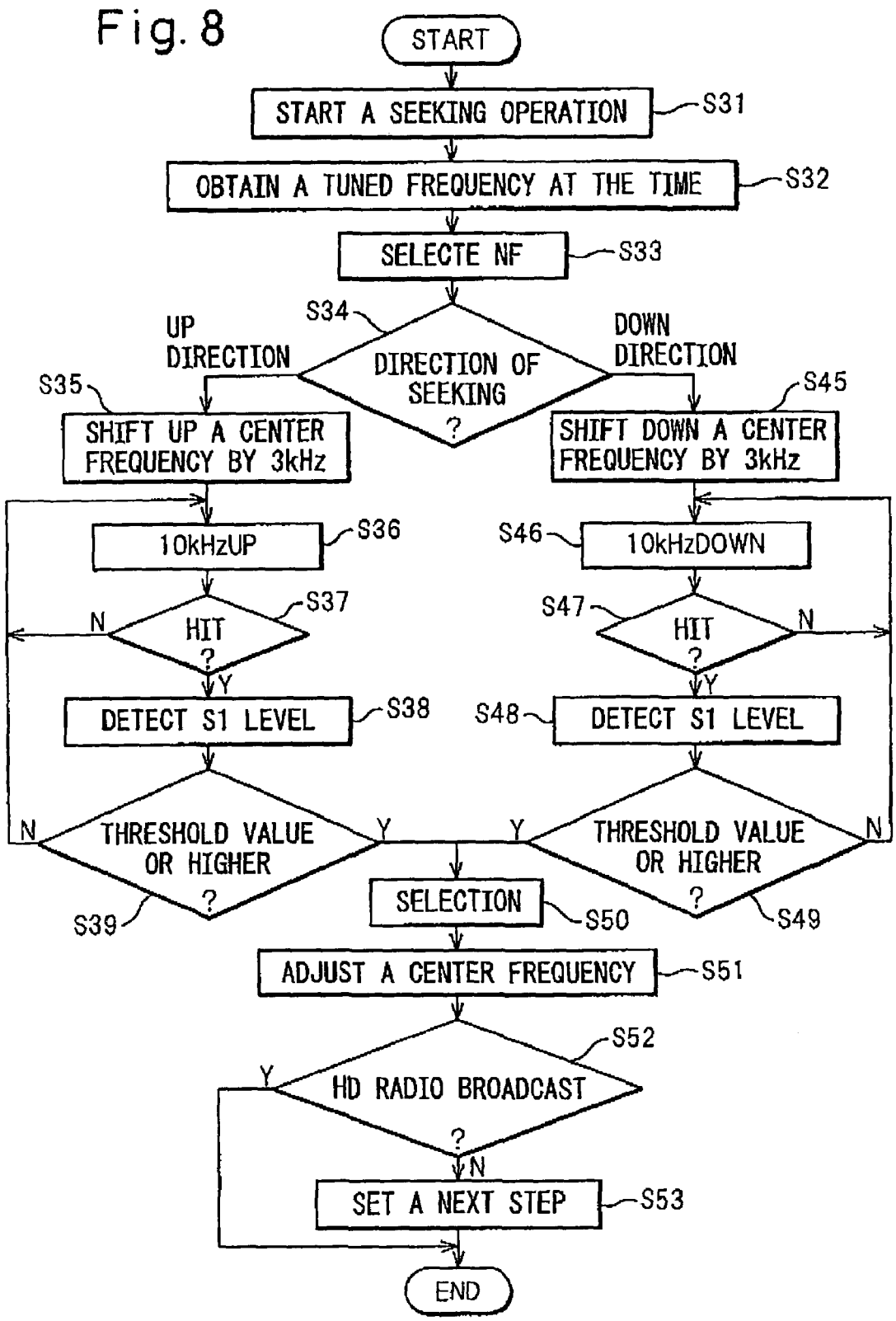
FIG. 8 is a flow chart showing a method for receiving AM according to the present invention.

FIG. 8 is a flow chart showing another example of a receiving method (for AM broadcasts) according to the present invention.

The receiving flow is carried out mainly by the controller 60, which works together with the respective components following a program that has been stored in advance in the controller 60 or the like in the radio receiver 1 shown in FIG. 1. At the point in time when the flow in FIG. 8 is carried out, the power of the radio receiver 1 is turned ON, so that the respective components are maintained in an operable state.

This process is started when the user operates a predetermined button (button for seeking upward or button for seeking downward) in the operation portion 80 (S31).

The controller 60 acquires information on the frequency tuned at the time when receiving instruction to start the seeking operation (S32). The controller 60 controls the IF filter circuit 30 and carries out switching, so that the NF 31 can be used (S33). In addition, in the seeking operation for an AM broadcast, the IF filter circuit 30 is controlled so as to always select the NF 31 for a bandwidth of 200 kHz. Furthermore, the controller 60 switches between the first and second switches 101 and 102 in the IF processor circuit 45 and controls the BPF for seeking AM 120 so that it can be used, and thus, receives a second sensing signal from the second level sensing portion 121.

In the case where the button operated by the user is a button for seeking upward, the controller 60 controls the preprocessing portion 20 so as to shift down the shift frequency for seeking from an allocated frequency by 3 kHz (S35). The controller 60 shifts up the tuned frequency by one frequency step (10 kHz) of the allocated frequency (S36). That is to say, the controller 60 controls the PLL tuning circuit 26 so that the tuning circuit 21 is tuned to the shift frequency, and thus, carries out control so that the center frequency of the BPF for seeking AM 120 coincides with the shift frequency.

Next, the controller 60 acquires a second sensing signal from the second level sensing portion 121 and determines whether or not carrier waves for a broadcast exist within the bandwidth of the BPF for seeking AM 120 (S37). Whether or not carrier waves for a broadcast exist is determined on the basis of the signal level and the like of the second sensing signal. In the case where it is determined that no carrier waves for a broadcast exist (no hit), the procedure returns to S36, and the tuned frequency is shifted up by one frequency step (10 kHz) of the allocated frequency, and thus, the subsequent operation is repeated.

In the case where it is determined in S37 that carrier waves for a broadcast exist (hit), the controller 60 acquires the signal level of the S1 level signal at the time from the RF-AGC circuit 23 (S38), and determines whether or not it is the threshold value level that has been set in advance or higher (S39). In the case where it is less than the threshold value level that has been set in advance, the procedure returns to S36, so that the tuned frequency is shifted up by one frequency step (10 kHz) of the allocated frequency, and then the subsequent operation is repeated. The setting of the threshold value level in S39 is described below.

In the case where the button operated by the user is a button for downward seeking, the controller 60 controls the preprocessing portion 20 and shifts the shift frequency for seeking downward from the allocated frequency by 3 kHz (S45). The controller 60 shifts down the tuned frequency by one frequency step (10 kHz) of the allocated frequency (S46). That is to say, the controller 60 controls the PLL tuning circuit 26 so that the tuning circuit 21 is tuned to the shift frequency, and carries out control so that the center frequency of the BPF for seeking AM 120 coincides with the shift frequency.

Next, the controller 60 acquires a second sensing signal from the second level sensing portion 121 and determines whether or not carrier waves for a broadcast exist within the bandwidth of the BPF for seeking AM 120 (S47). Whether or not carrier waves for a broadcast exist is determined on the basis of the signal level and the like of the second sensing signal. In the case where it is determined that no carrier waves for a broadcast exist (no hit), the procedure returns to S46, and the tuned frequency is shifted down by one frequency step (10 kHz) of the allocated frequency, and thus, the subsequent operation is repeated.

In the case where it is determined in S47 that carrier waves for a broadcast exist (hit), the controller 60 acquires the signal level of the S1 level signal at the time from the RF-AGC circuit 23 (S48), and determines whether or not it is the threshold value level that has been set in advance or higher (S49). In the case where it is less than the threshold value level that has been set in advance, the procedure returns to S46 so that the tuned frequency is shifted up by one frequency step (10 kHz) of the allocated frequency, and the subsequent operation is repeated. The setting of the threshold value level in S49 is described below.

In the case where it is determined in S37 or S47 that the signal level of the S1 level signal is the threshold value level or higher, the controller 60 switches between the first and third switches 101 and 103 in the IF processor circuit 45 so that the BPF for digital AM 150 can be used, and carries out control so that the carrier waves for an AM broadcast that pass through the NF 31 and the BPF for digital AM 150 are inputted into the IBOC processing portion 50 (S50).

The controller 60 adjusts the center frequency of the BPF for digital AM 150 so that the frequency gained by correcting the frequency selected in S36 or S46 by the amount shifted in S35 or S45 becomes the center frequency (S51).

The controller 60 determines on the basis of the output from the IBOC processing portion 50 whether the tuned carrier waves for a broadcast are carrier waves for an HD AM radio broadcast or carrier waves for an AM analog broadcast (S52).

The determination in S52 can be carried out depending on, for example, whether or not carrier waves for a digital broadcast are detected. In this case, the controller 60 switches the first and third switches 101 and 103 in the IF processor circuit 45, so that the BPF for digital AM 150 can be used, and carries out control so that the signal of carrier waves for an AM broadcast that passes through the NF 31 and the BPF for digital AM 150 is inputted into the IBOC processing portion 50 without change. Furthermore, the controller 60 can determine on the basis of the detection signal from the IBOC processing portion 50 whether the carrier waves are for an HD AM radio broadcast or a simple AM analog broadcast.

As a result of the determination in S52, in the case where the carrier waves are determined to be for an HD AM radio broadcast, a step for the next seeking operation is set (S53) as described below, and the sequence of the seeking operation is completed. Setting of a step for the next seeking operation means setting where the shift frequency of the BPF for seeking AM 120 which is shifted at the time of the next seeking operation is temporarily changed, and the details of this are described below.

Figure 9:
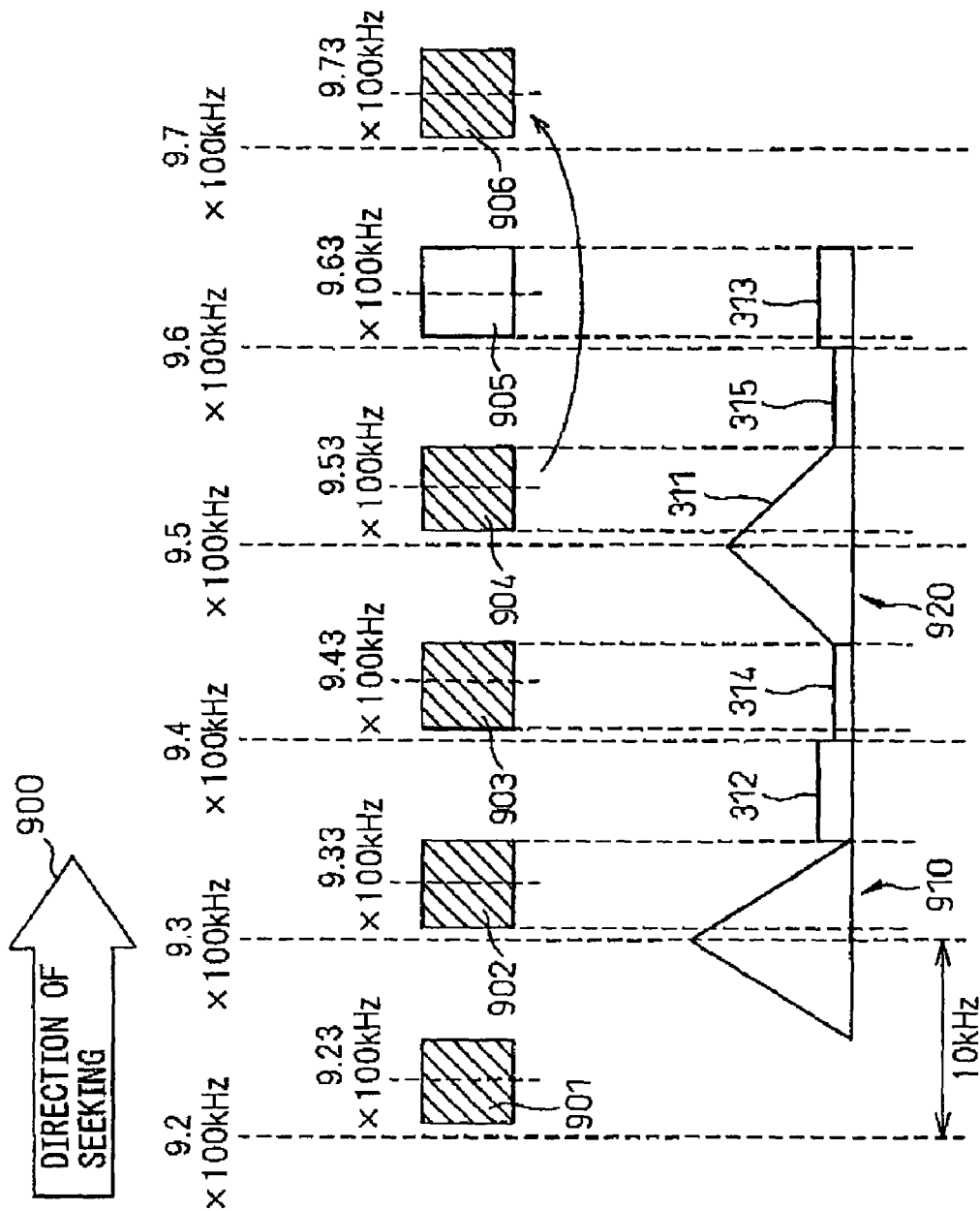
FIG. 9 is a diagram (3) illustrating a seeking operation.

FIG. 9 is a diagram for illustrating the upward seeking operation in the case of AM broadcasts.

In FIG. 9, arrow 900 indicates the direction of the upward seeking operation (direction in which the frequency is increased) and 901 to 906 indicate the BPF for seeking AM 120 (bandwidth: approximately 4 kHz) having the center frequency shifted up by 3 kHz (see S35 in FIG. 8).

AM broadcasting stations have a frequency band of which the center frequency is one of the allocated frequencies arranged for every 10 kHz. In the case of FIG. 9, carrier waves for an AM analog broadcast 910 having a center frequency of 930 kHz and carrier waves for an IBOC type HD AM radio broadcast 920 having a center frequency of 950 kHz (see FIG. 3 (*b*)) are in a range from 920 kHz to 970 kHz.

A tuned frequency is acquired, for example, at a certain point in time (see S32 in FIG. 8), the center frequency of the BPF for seeking AM 120 is adjusted so as to be shifted up from the acquired frequency by 3 kHz (see S35 in FIG. 8), the center frequency of the BPF for seeking AM 120 is shifted up by 10 kHz each time (see S36 in FIG. 8), and whether or not carrier waves for a broadcast exist in the bandwidth of the BPF for seeking AM 120 is determined.

In the case of FIG. 9, carrier waves for an analog broadcast 910 are detected at the point in time when the bandwidth of the BPF for seeking AM 120 is shifted up to 902, and the seeking operation is temporarily stopped. In the case where a speech sound is outputted on the basis of the carrier waves for an analog broadcast 910, the first and third switches 101 and 103 in the IF processor circuit 45 are switched, and thus, control is carried out so that the signal that passes through the BPF for analog AM 140 is outputted to the switching circuit 47.

After that, in the case where the upward seeking operation is started again, the portion of carrier waves for the second digital broadcast in carrier waves for an HD radio broadcast 920 is detected at the point in time when the bandwidth of the BPF for seeking AM 120 is shifted up to 903, but the seeking operation is not temporarily stopped by setting the threshold value level greater than that of the carrier waves for the second digital broadcast (see S39 in FIG. 8). After that, however, the portion of the carrier waves for an analog broadcast of the carrier waves for an HD radio broadcast 920 is detected, at the point in time when the bandwidth of the BPF for seeking AM 120 is shifted up to 904, and the seeking operation is temporarily stopped. At the point in time when the portion of the carrier waves for an analog broadcast of the carrier waves for an HD radio broadcast 920 is detected, it is determined in the controller 60 that the carrier waves for a broadcast 920 are carrier waves for an HD radio broadcast through the IBOC processing portion 50. In the case where a speech sound is outputted on the basis of the carrier waves for a digital broadcast 920, the first and third switches 101 and 103 in the IF processor circuit 45 are switched, so that the signal that passes through the BPF for digital AM 150 is outputted to the IBOC processing portion 50, and the switching circuit 47 is controlled so as to output the signal decoded in the IBOC processing portion 50.

In the case where the detected carrier waves for a broadcast are carrier waves for an HD radio broadcast, the next setting for a step is set so as to skip one step (see S53 in FIG. 8). Accordingly, in the case where the upward seeking operation is started again after this, the bandwidth of the BPF for seeking AM 120 is not shifted up to 905, but shifted up to 906 so as to skip one step.

In this manner, in the case of the upward seeking operation, the center frequency of the BPF for seeking AM 120 is set 3 kHz above the shift frequency, and thus, the portion of carrier waves for the digital broadcast on the lower side of an IBOC type HD AM radio broadcast (see 312 in FIG. 3 (*b*)) is not detected. That is to say, carrier waves for the first digital broadcast on the lower side (low frequency side) of the carrier waves for an IBOC type HD AM radio broadcast are not detected, and thus, the seeking operation is not unnecessarily temporarily stopped, and no noise is outputted.

In addition, in the case of the upward seeking operation, the threshold value of the S1 level is set higher than the level of the carrier waves for the second digital broadcast of the carrier waves for an IBOC type HD AM radio broadcast (see 314 and 315 in FIG. 3 (*b*)), and thus, the portion of the carrier waves for the second digital broadcast of carrier waves for an IBOC type HD AM radio broadcast is not detected. That is to say, carrier waves for the second digital broadcast of the carrier waves for an IBOC type HD AM radio broadcast are not detected, and thus, the seeking operation is not unnecessarily temporarily stopped, and no noise is outputted.

Furthermore, in the case where carrier waves for an IBOC type HD AM radio broadcast are one detected, the next step is shifted up by 20 kHz so as to skip one step, instead of being shifted up by 10 kHz (setting to 905 is skipped), and thus, the portion of the carrier waves for the first digital broadcast on the upper side of the carrier waves for an IBOC type HD AM radio broadcast (see 313 in FIG. 3 (*b*)) is not detected. That is to say, carrier waves for the first digital broadcast on the upper side (high frequency side) of carrier waves for an IBOC type HD AM radio broadcast are not detected, and thus, the seeking operation is not unnecessarily temporarily stopped, and no noise is outputted.

Figure 10:
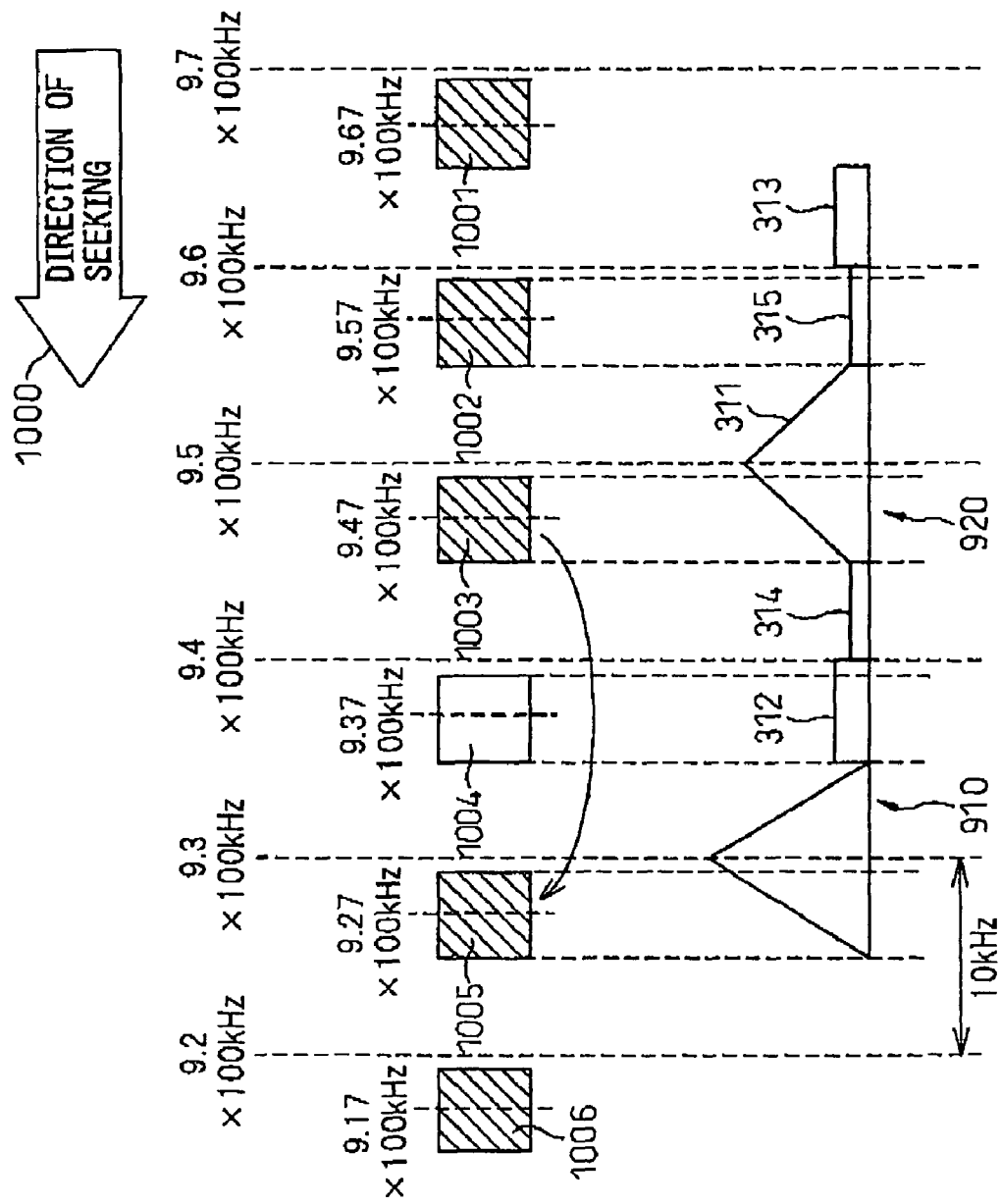
FIG. 10 is a diagram (4) illustrating a seeking operation.

FIG. 10 is a diagram illustrating the downward seeking operation in the case of AM broadcasts.

In FIG. 10, arrow 1000 indicates the direction of the downward seeking operation (direction in which the frequency is decreased) and 1001 to 1006 indicate the BPF for seeking AM

120 (bandwidth: approximately 4 kHz) having the center frequency shifted down by 3 kHz (see S45 in FIG. 8).

In the same manner as in the case of FIG. 9, in FIG. 10, carrier waves for an AM analog broadcast 910 having a center frequency of 930 kHz and carrier waves for an IBOC type HD AM radio broadcast 920 having a center frequency of 950 kHz (see FIG. 3 (*b*)) are in a range from 920 kHz to 970 kHz.

A tuned frequency is acquired, for example, at a certain point in time (see S32 in FIG. 8), the center frequency of the BPF for seeking AM 120 is adjusted so as to be shifted down from the acquired frequency by 3 kHz (see S45 in FIG. 8), the center frequency of the BPF for seeking AM 120 is shifted down by 10 kHz each time (see S46 in FIG. 8), and whether or not carrier waves for a broadcast exist in the bandwidth of the BPF for seeking AM 120 is determined.

In the case of FIG. 10, carrier waves for the second digital broadcast of the carrier waves for an IBOC type HD AM radio broadcast 920 are detected at the point in time when the bandwidth of the BPF for seeking AM 120 is shifted down to 1002, but the seeking operation is not temporarily stopped by setting the threshold value level higher than that of the carrier waves for the second digital broadcast (see S49 in FIG. 8). However, at the point in time when the bandwidth of the NF 31 is shifted down to 1003 after this, carrier waves for an analog broadcast of the carrier waves for an HD radio broadcast 920 are detected, and the seeking operation is temporarily stopped. At the point in time when the carrier waves for an analog broadcast of the carrier waves for an IBOC type HD AM radio broadcast 920 are detected, it is determined in the controller 60 that the carrier waves for a broadcast 920 are carrier waves for an HD radio broadcast through the IBOC processing portion 50. In the case where the detected carrier waves for a broadcast are carrier waves for an HD radio broadcast, the next setting for a step is set so as to skip one step (see S54 in FIG. 8). Accordingly, in the case where the downward seeking operation is started again after this, the bandwidth of the BPF for seeking AM 120 is shifted down to 1005 so as to skip one step instead of being shifted down to 1004.

In this manner, in the case of the downward seeking operation, the center frequency of the BPF for seeking AM 120 is set 3 kHz below the shift frequency, and thus, the portion of carrier waves for the digital broadcast on the upper side of an IBOC type HD AM radio broadcast (see 313 in FIG. 3 (*b*)) is not detected. That is to say, carrier waves for the first digital broadcast on the upper side (high frequency side) of the carrier waves for an IBOC type HD AM radio broadcast are not detected, and thus, the seeking operation is not unnecessarily temporarily stopped, and no noise is outputted.

In addition, in the case of the downward seeking operation, the threshold value of the S1 level is set higher than the level of the carrier waves for the second digital broadcast of the carrier waves for an IBOC type HD AM radio broadcast (see 314 and 315 in FIG. 3 (*b*)), and thus, the portion of the carrier waves for the second digital broadcast of carrier waves for an IBOC type HD AM radio broadcast is not detected. That is to say, carrier waves for the second digital broadcast of the carrier waves for an IBOC type HD AM radio broadcast are not detected, and thus, the seeking operation is not unnecessarily temporarily stopped, and no noise is outputted.

Furthermore, in the case where carrier waves for an IBOC type HD AM radio broadcast are detected once, the next step is shifted down by 20 kHz so as to skip one step, instead of being shifted down by 10 kHz (setting to 1004 is skipped), and thus, the portion of the carrier waves for the first digital broadcast on the lower side of the carrier waves for an IBOC type HD AM radio broadcast (see 312 in FIG. 3 (*b*)) is not detected. That is to say, carrier waves for the first digital broadcast on the lower side (low frequency side) of carrier waves for an IBOC type HD AM radio broadcast are not detected, and thus, the seeking operation is not unnecessarily temporarily stopped, and no noise is outputted.

Here, in the above described example of the method for receiving AM, the amount of shift (3 kHz) of the center frequency of the BPF for seeking AM 120 and the bandwidth of the BPF for seeking AM 120 are examples, and it is possible to select other appropriate values on the basis of the profile of the carrier waves for an HD AM radio broadcast. The amount of shift of the center frequency and the bandwidth of the BPF for seeking AM 120 may be set so as to avoid the carrier waves for the first digital broadcast in the carrier waves for an HD AM radio broadcast which exists on the front side when facing the seeking direction, for example.

Though a receiver which is adapted to both types of broadcast (FM broadcast and AM broadcast) having different modulation methods is described above, it is possible for one receiver to be formed so as to correspond only to one.

It is described above that the next setting is controlled so as to skip one step in the case where carrier waves for an analog broadcast of the carrier waves for an IBOC type hybrid broadcast are detected in the case of two types of broadcast (FM broadcast and AM broadcast) having two different modulating methods (S23 in FIG. 4 and S53 in FIG. 8). However, it is also possible to increase the sensing level of the second sensing signal only at the time of the next detection, instead of carrying out control to skip one step, and thus carry out control so that carrier waves for a digital broadcast of carrier waves for the same IBOC type hybrid broadcast are not detected. Here, though carrier waves for an IBOC type broadcast are cited as an example in the description of the embodiment of the present specification, the present invention can be applied to carrier waves for the same or a similar hybrid broadcast in the same manner.

What is claimed is:

1. A radio receiver for receiving carrier waves for hybrid broadcasts in which carrier waves for digital broadcasts are arranged so as to be adjacent to and located on both sides of carrier waves for analog broadcasts in frequency bands, comprising:
    a tuner that tunes to a broadcast frequency; and
    a controller that sets a center frequency of a shift frequency in a range where carrier waves for analog broadcast can be detected and allows said tuner to tune to the set shift frequency,
    wherein said center frequency of said shift frequency is shifted from an allocated frequency for said broadcast frequency by a predetermined amount that is set to avoid one of said carrier waves for digital broadcasts.

2. The radio receiver according to claim 1, wherein said controller changes the direction in which said shift frequency is shifted from said allocated frequency for said broadcast frequency in accordance with the direction for tuning.

3. The radio receiver according to claim 1, wherein said controller changes the step value for the next shift frequency when a carrier wave for a hybrid broadcast is detected.

4. The radio receiver according to claim 1, wherein said controller changes the detection level of the carrier wave for a hybrid broadcast based on the next signal for detecting the carrier waves for said broadcast when a carrier wave for a hybrid broadcast is detected.

5. A radio receiver for receiving carrier waves for hybrid broadcasts, where carrier waves for first digital broadcasts are arranged so as to be adjacent to and located on both sides of carrier waves for analog broadcasts in frequency bands, and carrier waves for second digital broadcasts are arranged so as to be located between carrier waves for said first digital broadcasts and carrier waves for said analog broadcasts, comprising:

a tuner that tunes to a broadcast frequency; and a controller that sets a center frequency of a shift frequency in a range where carrier waves for a second digital broadcast can be detected and allows said tuner to tune to the set shift frequency, wherein said center frequency of said shift frequency is shifted from an allocated frequency for said broadcast frequency by a predetermined amount that is set to avoid one of said carrier waves for digital broadcasts.

6. The radio receiver according to claim 5, wherein said controller changes the direction in which said shift frequency is shifted from said allocated frequency for said broadcast frequency in accordance with the direction for tuning.

7. The radio receiver according to claim 5, wherein said controller changes the step value for the next shift frequency when a carrier wave for a hybrid broadcast is detected.

8. The radio receiver according to claim 5, wherein said controller changes the detection level of the carrier wave for a hybrid broadcast based on the next signal for detecting the carrier waves for said broadcast when a carrier wave for a hybrid broadcast is detected.

9. A method for detecting carrier waves for hybrid broadcasts in a radio receiver for receiving carrier waves for hybrid broadcasts which are arranged so as to be adjacent to and located on both sides of carrier waves for analog broadcasts in frequency bands, the method comprising the steps of:

setting a center frequency of shift frequency in a range where carrier waves for an analog broadcast can be detected, said center frequency of said shift frequency being shifted from an allocated frequency for said broadcast frequency by a predetermined amount that is set to avoid one of said carrier waves for digital broadcasts; and tuning to carrier waves for a broadcast in the set shift frequency.

10. A method for detecting carrier waves for hybrid broadcasts in a radio receiver for receiving carrier waves for hybrid broadcasts, where carrier waves for first digital broadcasts are arranged so as to be adjacent to and located on both sides of carrier waves for analog broadcasts in frequency bands, and carrier waves for second digital broadcasts are arranged so as to be located between carrier waves for said first digital broadcasts and carrier waves for said analog broadcasts, the method comprising the steps of:

setting a center frequency of shift frequency in a range where carrier waves for a second digital broadcast can be detected, said center frequency of said shift frequency being shifted from an allocated frequency for said broadcast frequency by a predetermined amount that is set to avoid one of said carrier waves for digital broadcasts; and tuning to carrier waves for a broadcast in the set shift frequency.

* * * * *